(12) United States Patent
Kim et al.

(10) Patent No.: US 6,864,724 B1
(45) Date of Patent: Mar. 8, 2005

(54) CURRENT TO VOLTAGE CONVERSION CIRCUIT FOR PHOTO DETECTOR INTEGRATED CIRCUIT EMPLOYING GAIN SWITCHING CIRCUIT

(75) Inventors: Sang-Suk Kim, Kyunggi-Do (KR); Kyoung-Soo Kwon, Kyunggi-Do (KR); Chang-Woo Ha, Kyunggi-Do (KR); Jung-Chul Gong, Seoul (KR)

(73) Assignee: Samsung Electro-Mechanics Co., Ltd., Kyunggi-Do (KR)

( * ) Notice: Subject to any disclaimer, the term of this patent is extended or adjusted under 35 U.S.C. 154(b) by 0 days.

(21) Appl. No.: 10/728,557

(22) Filed: Dec. 4, 2003

(30) Foreign Application Priority Data

Oct. 1, 2003 (KR) ................................ 10-2003-0068413

(51) Int. Cl.[7] ............................................. H02M 11/00
(52) U.S. Cl. ...................................................... 327/103
(58) Field of Search ................................. 327/100, 103, 327/52–54, 65–67, 89, 514; 330/252–254, 261, 278

(56) References Cited

U.S. PATENT DOCUMENTS 5,585,731 A * 12/1996 Tsuchida et al. ............ 324/537
6,400,190 B1 * 6/2002 Lacombe ..................... 327/110
6,496,317 B2 * 12/2002 Lacombe ..................... 360/68
6,566,955 B1 * 5/2003 Tang ........................... 330/288
6,784,750 B2 * 8/2004 Chiou et al. ................. 330/308

FOREIGN PATENT DOCUMENTS

JP        11186856 A        7/1999

* cited by examiner

Primary Examiner—My-Trang Nu Ton
(74) Attorney, Agent, or Firm—Christensen O'Connor Johnson Kindness PLLC

(57) ABSTRACT

A current to voltage conversion circuit for improving the speed of a photoelectric conversion device and frequency characteristics of an amplifier by improving a method for switching the gain of an amplification circuit for a photo detector integrated circuit (PDIC). Photocurrent generated in the photoelectric conversion device, such as a photodiode, is transferred to the amplifier by means of current mirroring, so as to raise a bias voltage to the photoelectric conversion device and enhance a response speed thereof. Further, the amount of current generated in the photoelectric conversion device is adjusted through control of a resistance ratio of a current mirror circuit. Therefore, a fixed feedback resistor can be used for the amplifier irrespective of modes, so as to enhance frequency characteristics of the amplifier.

14 Claims, 7 Drawing Sheets

CURRENT TO VOLTAGE CONVERSION CIRCUIT FOR PHOTO DETECTOR INTEGRATED CIRCUIT EMPLOYING GAIN SWITCHING CIRCUIT

CROSS-REFERENCE TO RELATED APPLICATION

This application claims the benefit of Korean Patent Application No. 2003-68413, filed Oct. 1, 2003, in the Korean Intellectual Property Office, the disclosure of which is incorporated herein by reference.

BACKGROUND OF THE INVENTION

1. Field of the Invention

The present invention relates to a current to voltage conversion circuit for a photo detector integrated circuit (PDIC) employing a gain switching circuit.

The present invention relates, more particularly, to a current to voltage conversion circuit for improving the speed of a photoelectric conversion device and frequency characteristics of an amplifier by improving a method for switching the gain of an amplification circuit for a PDIC, wherein photocurrent generated in the photoelectric conversion device, such as a photodiode, is transferred to the amplifier by means of current mirroring, thereby raising a bias voltage to the photoelectric conversion device and enhancing a response speed thereof.

The present invention further relates to a current to voltage conversion circuit for adjusting the amount of current generated in a photoelectric conversion device through control of a resistance ratio of a current mirror circuit so that a fixed feedback resistor can be used for an amplifier irrespective of modes, so as to enhance frequency characteristics of the amplifier.

2. Description of the Related Art

In general, an optical pickup apparatus, which reads or writes information from/on an optical storage medium such as a compact disc-rewritable (CD-RW), employs a PDIC for detecting light that is projected from a laser diode and then reflected from the optical storage medium, or optical disc, and converting the detected light into an electrical signal.

In a writable CD, such as the CD-RW, a write operation is performed by projecting laser beams with strong power onto the surface of the CD to form pits thereon. During this write operation of the CD, excessive power may be applied to the PDIC, resulting in a large amount of current being generated from the PDIC. Such current from the PDIC saturates an amplification circuit of a current to voltage conversion circuit for the PDIC, thereby causing a transient response characteristic of the amplification circuit to be distorted.

Two methods have been conventionally proposed to prevent the amplification circuit of the current to voltage conversion circuit from being saturated during the write operation of the CD. One is to use a limiter circuit that detects a voltage or current in the amplification circuit and supplies limiter current for compensation for feedback current if the detected voltage or current is above a predetermined value. The other is to use different amplifiers and feedback resistors with different resistances according to read and write modes to prevent the amplification circuit of the current to voltage conversion circuit for the PDIC from being saturated during the write operation.

In a different manner from a read only PDIC, a PDIC for a read/write system can be used in various application fields such as the CD-RW, a digital versatile disc-rewritable (DVD-RW), etc., so it needs a mode switching operation based on each of the application fields. Because an output voltage from the PDIC has a different level based on each mode, a gain switching function is essentially provided in the PDIC, but a high-resistance resistor is required as a feedback resistor to be connected to an amplifier in some modes. The use of this high-resistance feedback resistor not only reduces the overall response speed of the PDIC, but also deteriorates noise characteristics thereof. Therefore, there is a need to make up for such problems.

FIG. 1 is a circuit diagram showing the configuration of a conventional current to voltage conversion circuit employing a gain switching circuit. In this drawing, carriers are generated in a photodiode 11 due to light incident thereon, thereby causing current $I_{PH}$ to be generated in the photodiode 11. The current $I_{PH}$ pulls current $I_F$ from an output terminal $V_{OUT1}$ or $V_{OUT2}$ of the current to voltage conversion circuit, so the current $I_F$ flows through a resistor $R_{F1}$ and capacitor $C_{F1}$ or a resistor $R_{F2}$ and capacitor $C_{F2}$. At this time, a potential difference is generated across the resistor $R_{F1}$ and capacitor $C_{F1}$ or the resistor $R_{F2}$ and capacitor $C_{F2}$, thereby allowing the current $I_F$ to be converted into a voltage $V_{out1}$ or $V_{out2}$ as follows: $I_F \times R_{F1} = V_{out1}$ or $I_F \times R_{F2} = V_{out2}$. Because input current to an amplifier 12 is close to 0, $I_F \approx I_{PH}$ at an input terminal $T_{in}$ thereof.

In a read mode where a weak optical signal is inputted to the photodiode 11, a switch SW1 is turned on in response to a switching control signal provided from an external control block (not shown), whereas a switch SW2 is turned off in response thereto. As a result, the voltage $I_F \times R_{F1} = V_{out1}$ is outputted at the output terminal $V_{OUT1}$ through a read amplifier 13. Alternatively, in a write mode where a strong optical signal is inputted to the photodiode 11, the switch SW1 is turned off, whereas the switch SW2 is turned on. As a result, the voltage $I_F \times R_{F2} = V_{out2}$ is outputted at the output terminal $V_{OUT2}$ through a write amplifier 14.

The amplifier 12 ideally has an infinite gain and constant direct current (DC) input voltage, but practically a limited gain and variable DC input voltage, resulting in an offset voltage being generated therein. For this reason, a resistor $R_C$ is connected to another input terminal of the amplifier 12 to set the offset voltage of the amplifier 12 to 0.

FIG. 2 is a circuit diagram illustrating the operation of a current mirror that is used as a constant current source in a conventional circuit constructed with transistors.

With reference to FIG. 2, if Kirchhoff's current law is applied to a voltage $V_x$ on the assumption that the same amount of current $I_{REF}$ as that of current $I_{PH}$ generated with the input of an optical signal to a photoelectric conversion device, for example, photodiode, 21 flows in a current source 22, the result is:

$$I_{C1} + I_{B1} + I_{B2} = I_{REF}$$

If amplification factors of transistors $Q_1$ and $Q_2$ are $\beta$.

$$I_{C1} + \frac{I_{C1}}{\beta} + \frac{I_{C2}}{\beta} = I_{REF}$$

Assuming that $I_{C1} \approx I_{C2}$, $I_{C2}=I_O$, thus $$I_O + \frac{2}{\beta} = I_{REF}$$

Arranging the above equation with respect to $I_O$, the result is:

$$I_O = \frac{\beta}{\beta+2} \cdot I_{REF}$$

Here, assuming that $\beta=30$, $I_O$ becomes about $0.93 \cdot I_{REF}$. That is, the same amount of current $I_{REF}$ as that of current generated in the photoelectric conversion device 21 flows from an emitter of the transistor $Q_1$ to a collector thereof, and almost the same amount of current $I_O$ as that of the current $I_{REF}$ is generated in the transistor $Q_2$ by means of mirroring.

FIG. 3 is a detailed circuit diagram of the conventional current to voltage conversion circuit for the PDIC employing the gain switching circuit, shown in FIG. 1.

In FIG. 3, the current mirror 12 is a current source for supplying current to the read amplifier 13 and write amplifier 14, which includes a pair of differential amplifiers $Q_1$ and $Q_2$ and active loads $Q_3$ and $Q_4$. The differential amplifiers $Q_1$ and $Q_2$ and active loads $Q_3$ and $Q_4$ are of a typical bipolar junction transistor (BJT) type. The current mirror 12, read amplifier 13 and write amplifier 14 constitute one amplification circuit 15.

The read amplifier 13 is used for, for example, a digital versatile disc-read only memory (DVD-ROM) to convert current generated when a weak optical signal is inputted to the photodiode 11, into a voltage and amplify the converted voltage. The high-resistance feedback resistor $R_{F1}$ is connected between the output terminal $V_{OUT1}$ and the input terminal $T_{in}$.

The write amplifier 14 acts to convert excessive current generated when a strong optical signal is inputted to the photodiode 12, into a voltage and amplify the converted voltage. The relatively low-resistance feedback resistor $R_{F2}$ is connected between the output terminal $V_{OUT2}$ and the input terminal $T_{in}$ to limit the output voltage to a constant value even though excessive current is generated.

However, the above-mentioned conventional current to voltage conversion circuit for the PDIC employing the gain switching circuit has a disadvantage in that the feedback resistors having their different resistances based on the modes are required for gain switching when current is generated according to the input of an optical signal, thereby reducing the overall response speed of the PDIC and deteriorating noise characteristics thereof.

Further, in the conventional current to voltage conversion circuit for the PDIC employing the gain switching circuit, the mode switching operation is performed based on the switching control signal provided from the external control circuit, and the current source for current supply is positioned between the photodiode and the read and write amplifiers, resulting in a long distance from the photodiode to the read and write amplifiers. As a result, noise characteristics of the PDIC are subject to deterioration.

Furthermore, in the conventional current to voltage conversion circuit for the PDIC, as shown in FIG. 3, a bias voltage is applied to the photoelectric conversion device 11 through the current mirror 12 that acts as the current source in the current to voltage conversion circuit. As a result, provided that a drive voltage $V_{CC}$ is 5V, a reverse bias voltage to the photoelectric conversion device 11 will be no more than 2.1V or 2.5V. Note that the photoelectric conversion device 11 has a depletion layer whose size increases with the level of a bias voltage applied thereto. In this regard, the limited bias voltage causes an insufficient extension of the depletion layer of the photoelectric conversion device 11 and, in turn, an increase in parasitic capacitance thereof. Consequently, a product of the parasitic capacitance of the photoelectric conversion device 11 and the feedback resistance $R_f$ increases, resulting in an increase in a time constant influencing high frequency characteristics. In conclusion, the limited bias voltage adversely affects high frequency characteristics of the current to voltage conversion circuit.

On the other hand, Japanese Patent Laid-open Publication No. Heisei 11-186856 discloses a current to voltage conversion circuit for switching feedback resistors with different resistances according to read and write modes to prevent transistors in an amplification circuit from being saturated. In the disclosed circuit, however, in a similar manner to that stated previously with reference to FIG. 3, the feedback resistances reduce the overall response speed of a PDIC and deteriorate noise characteristics thereof.

SUMMARY OF THE INVENTION

Therefore, the present invention has been made in view of the above problems, and it is an object of the present invention to provide a current to voltage conversion circuit employing a gain switching circuit, which is capable of current-mirroring photocurrent generated in a photoelectric conversion device such as a photodiode to raise a bias voltage to the photoelectric conversion device so as to enhance a response speed thereof.

It is another object of the present invention to provide a current to voltage conversion circuit employing a gain switching circuit, which is capable of adjusting the amount of current generated in a photodiode through control of a resistance ratio of a current mirror circuit so that one feedback resistor can be used for an amplifier irrespective of operation modes, so as to enhance frequency characteristics of the amplifier.

In accordance with the present invention, the above and other objects can be accomplished by the provision of a current to voltage conversion circuit employing a gain switching circuit, comprising: a photoelectric conversion device for receiving an optical signal and generating current corresponding thereto; a current mirror connected between a drive voltage and the photoelectric conversion device for supplying the same amount of current as that of the current generated by the photoelectric conversion device; an amplifier for receiving a current signal and outputting a voltage signal corresponding thereto; a read connection transistor connected in parallel with the photoelectric conversion device for transferring the current from the current mirror to an input terminal of the amplifier; a read emitter resistor connected to an emitter of the read connection transistor; a write connection transistor connected in parallel with the photoelectric conversion device for transferring the current from the current mirror to the input terminal of the amplifier; a write emitter resistor connected to an emitter of the write connection transistor; a switching block for selectively turning on the read connection transistor and the write connection transistor by means of mirroring in response to a switching control signal; and a feedback resistor connected between the input terminal of the amplifier and an output terminal of the amplifier.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1:
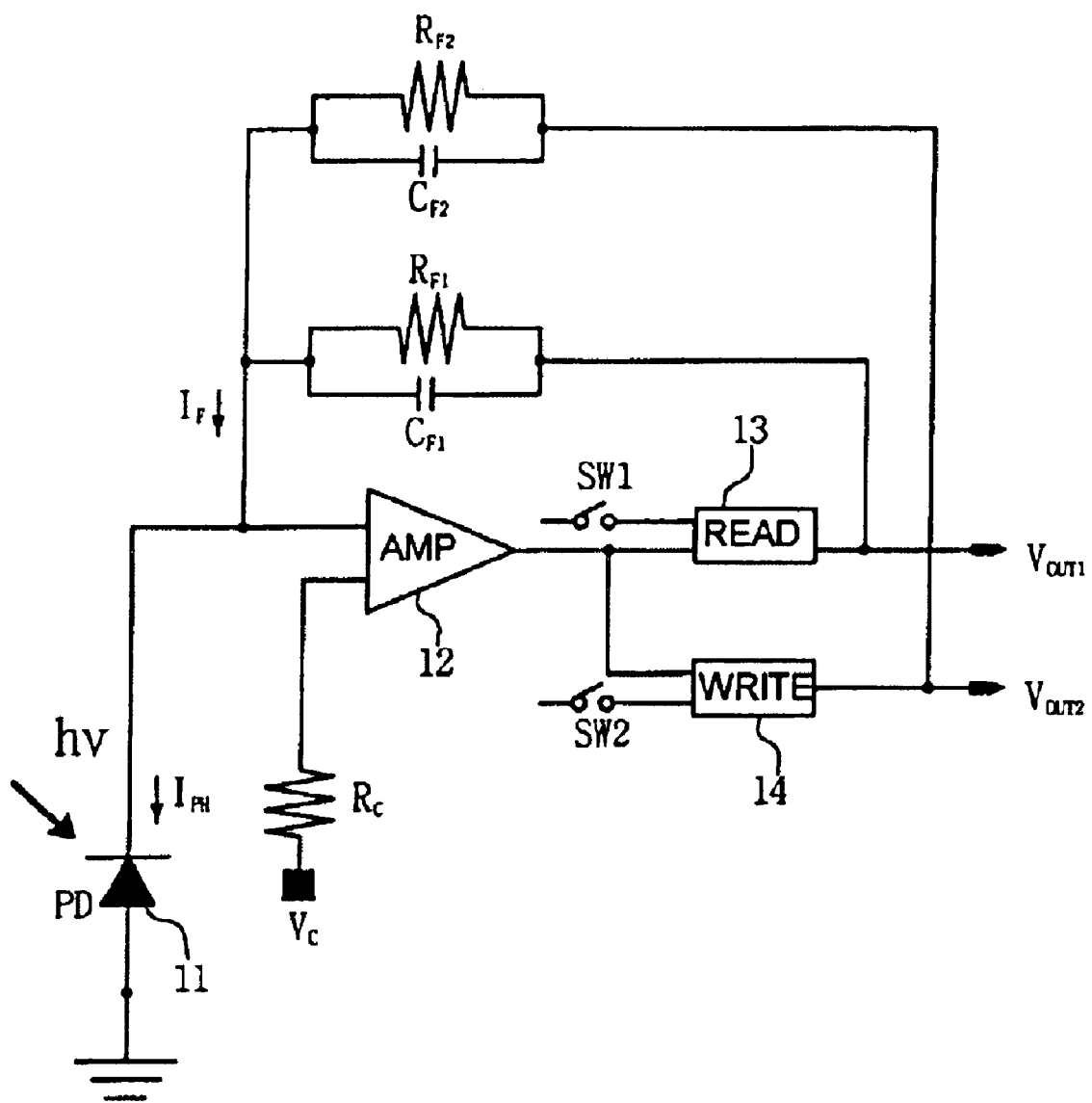
FIG. 1 is a circuit diagram showing the configuration of a conventional current to voltage conversion circuit employing a gain switching circuit.
Figure 2:
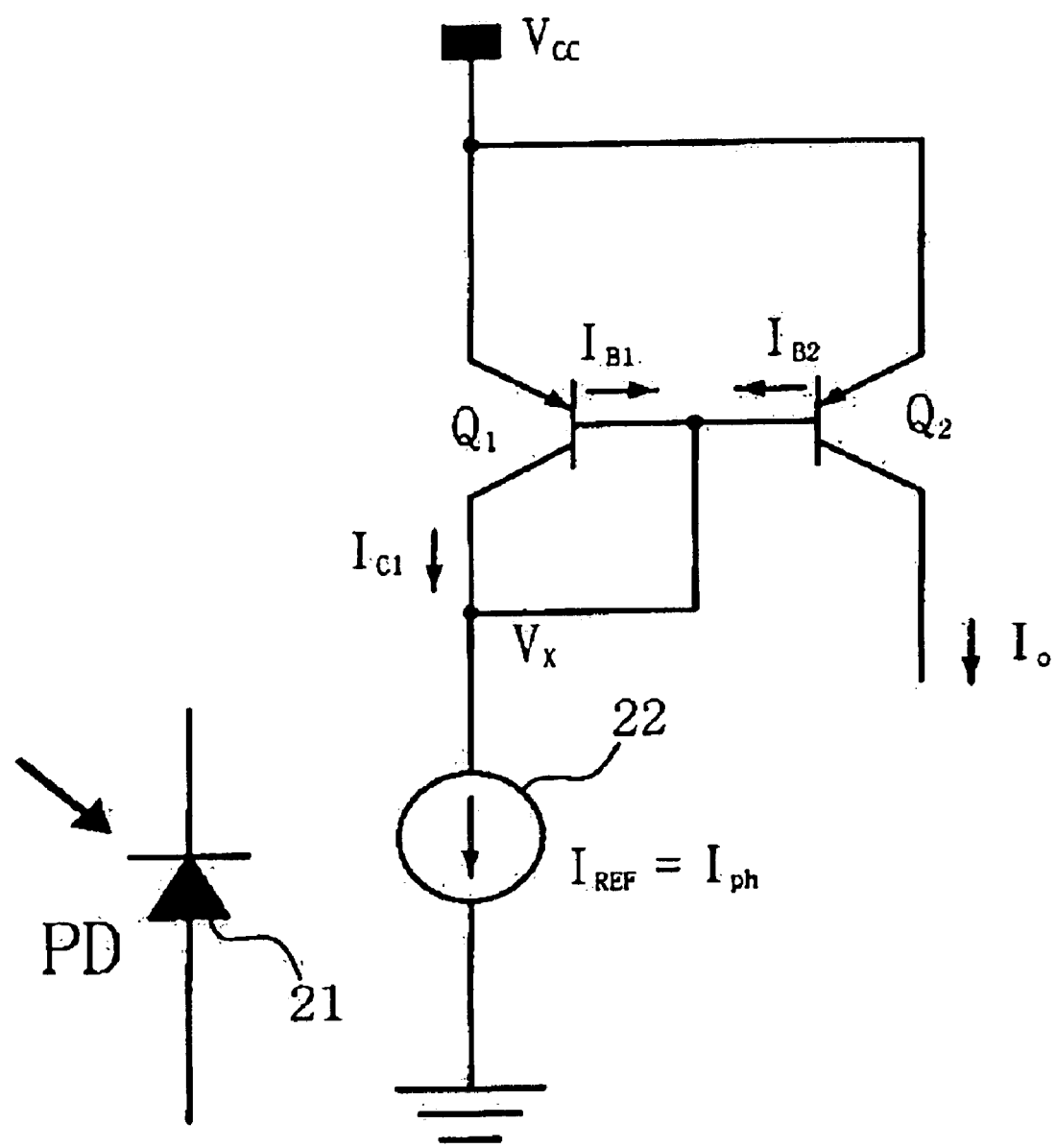
FIG. 2 is a circuit diagram illustrating the operation of a current mirror that is used as a constant current source in a conventional circuit constructed with transistors.
Figure 3:
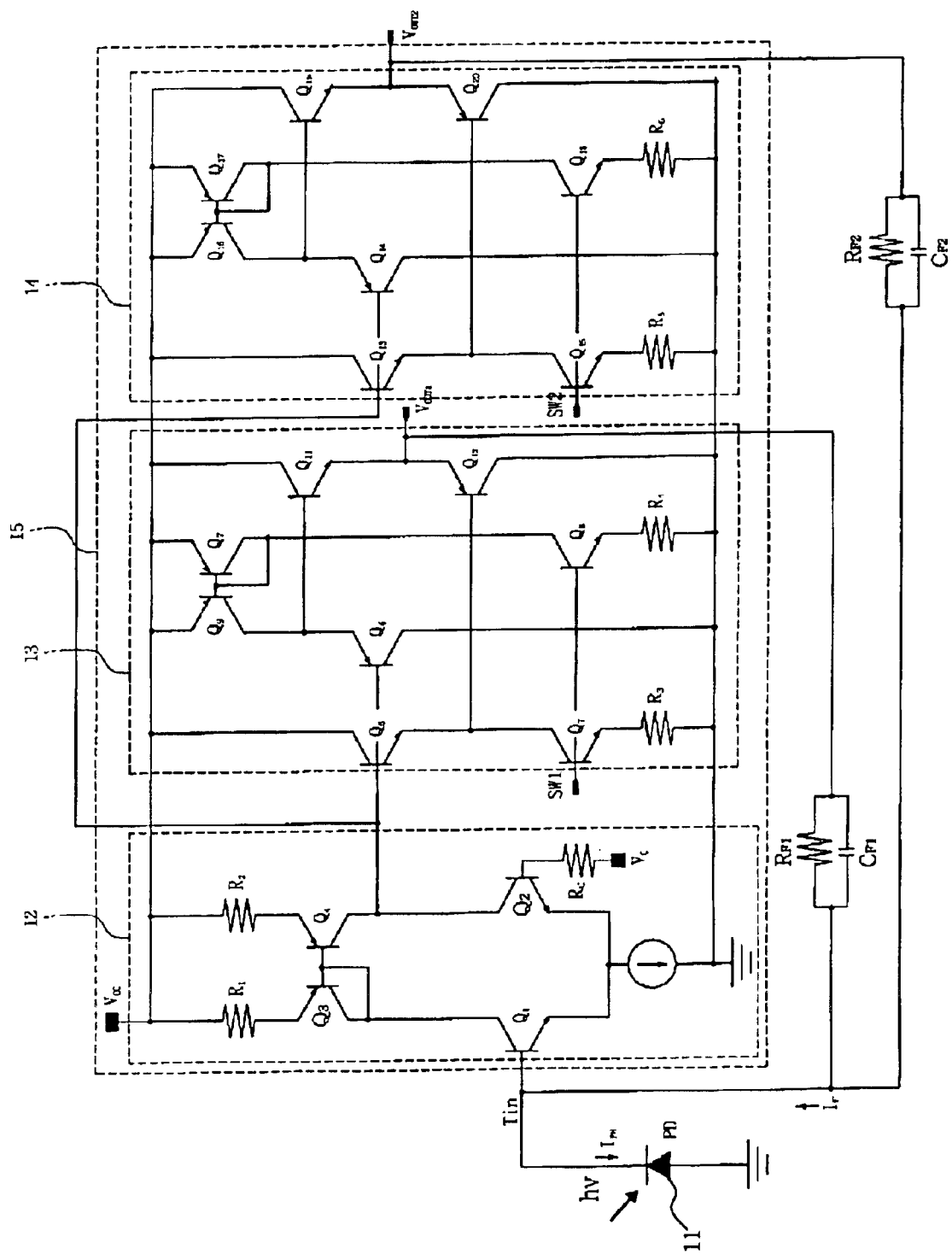
FIG. 3 is a detailed circuit diagram of the conventional current to voltage conversion circuit employing the gain switching circuit.
Figure 4:
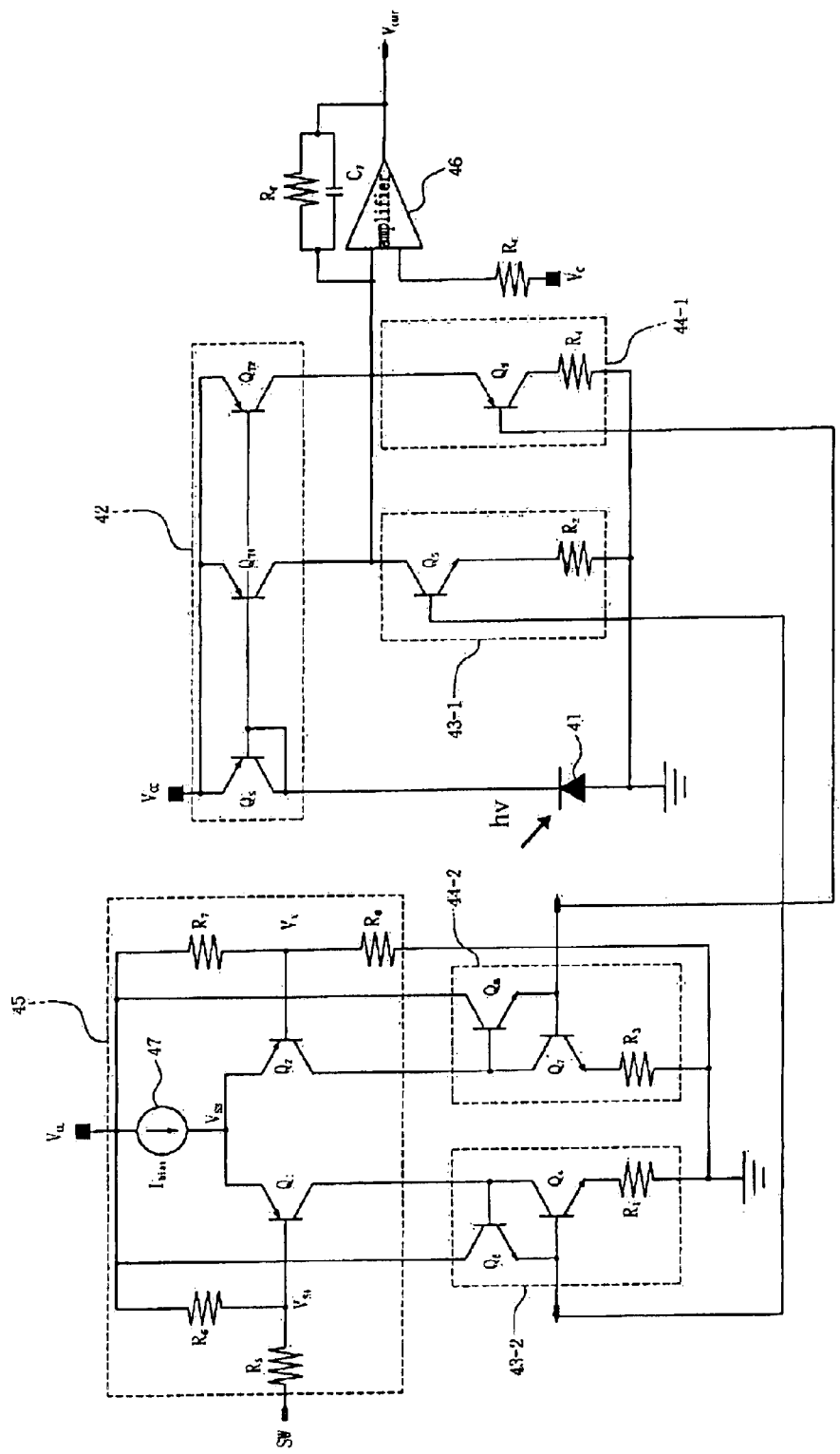
FIG. 4 is a circuit diagram showing the configuration of a current to voltage conversion circuit employing a gain switching circuit according to a preferred embodiment of the present invention.

FIG. 4 is a circuit diagram showing the configuration of a current to voltage conversion circuit employing a gain switching circuit according to a preferred embodiment of the present invention.

In FIG. 4, a current mirror 42 is provided with transistors $Q_s$, $Q_{T1}$ and $Q_{T2}$ and adapted to transfer current generated in a photoelectric conversion device 41 to a read connection transistor $Q_5$ and write connection transistor $Q_9$ by means of mirroring.

If an optical signal is inputted to the photoelectric conversion device 41, such as a photodiode, current $I_{PH}$ is generated in the device 41 in proportion to the intensity of the inputted light. The generated current $I_{PH}$ flows from an emitter of the transistor $Q_s$ to a collector thereof, and almost the same amount of current as that of the current flowing through the transistor $Q_s$ flows through each of the transistors $Q_{T1}$ and $Q_{T2}$. In a read mode, current is supplied to the read connection transistor $Q_5$ through a current mirror consisting of the transistors $Q_s$ and $Q_{T1}$. In a write mode, current is supplied to the write connection transistor $Q_9$ through a current mirror consisting of the transistors $Q_s$ and $Q_{T2}$.

A switching block 45 functions to turn on current switching transistors $Q_1$ and $Q_2$ in response to a voltage signal inputted to a switching terminal SW. The voltage signal, a switching control signal generated in a control circuit (not shown) of a PDIC, is inputted to the switching block 45 through the switching terminal SW.

It is hereinafter assumed that the switching control signal from the control circuit of the PDIC, inputted to the switching terminal SW, is 0V in the read mode and 5V in the write mode. It is also assumed that a drive voltage $V_{CC}$ is 5V and a first voltage-dividing resistor $R_7$ and a second voltage-dividing resistor $R_8$ have the same resistances, namely, $R_7=R_8$. Note that these assumptions may be modified according to different embodiments of the present invention.

In FIG. 4, a current source 47 is a constant bias current source for applying bias current.

In a read operation of the PDIC, a weak optical signal is inputted to the photoelectric conversion device 41, thereby causing weak current to be generated therein. The read switching transistor $Q_1$ is turned on in response to the voltage signal at the switching terminal SW of the switching block 45. As a result, current flows through current source transistors $Q_4$ and $Q_6$, and the read connection transistor $Q_5$ is turned on by means of read current mirrors 43-1 and 43-2 to transfer the current generated in the photoelectric conversion device 41 to an input terminal of an amplifier 46 through the current source current mirror 42.

In the read mode, if 0V is inputted to the switching terminal SW, then $V_X=V_{cc}/2=2.5V$ according to the voltage divider rule since $R_7=R_8$. When 0V is inputted to the switching terminal SW, a base voltage of the transistor $Q_1$ becomes $$\frac{R_5}{R_5+R_6} \cdot V_{cc}$$

according to the voltage divider rule and an emitter voltage thereof becomes $V_x+0.7V$. The transistor $Q_1$ is turned on under the condition that an emitter-base voltage $V_{BEQ1}$ thereof exceeds 0.7V, namely, $$(V_x + 0.7 \text{ V}) - \frac{R_5}{R_5+R_6} \cdot V_{cc} > 0.7 \text{ V}.$$

Here, because $V_X=V_{CC}/2$, the transistor $Q_1$ is turned on when $R_6>R_5$. Preferably, $R_6$ is set to four times $R_5$, namely, $R_6=4R_5$, to guarantee a stable circuit operation.

Assuming that $R_6=4R_5$, the switching block 45 is operated in the following manner. Because the base voltage $V_{S1}$ of the transistor $Q_1$ is 1V according to the voltage divider rule, the transistor $Q_1$ is turned on, so the emitter voltage $V_{S2}$ thereof becomes $V_{S1}+0.7=1.7V$. At this time, since the base voltage $V_X$ of the transistor $Q_2$ is 2.5V and the emitter voltage $V_{S2}$ thereof is 1.7V, the transistor $Q_2$ remains off.

In the read mode, the read current mirror 43-1 composed of the read connection transistor $Q_5$ and the read current mirror 43-2 composed of the read current source transistor $Q_4$ and auxiliary read current source transistor $Q_6$ receive current from the read switching transistor $Q_1$ and supply bias current to the input terminal of the amplifier 46 at the same time as turning on the read connection transistor $Q_5$.

Since the transistor $Q_1$ is on and the transistor $Q_2$ is off, current flows through the read current source transistor $Q_4$ and auxiliary read current source transistor $Q_6$ so as to activate the read current mirrors 43-1 and 43-2. As a result, the read connection transistor $Q_5$ is turned on to supply current to the PDIC, thereby allowing the PDIC to be operated in the read mode. Because the transistor $Q_2$ remains off, write current mirrors 44-1 and 44-2 are kept inactive and no current flows through a current source transistor $Q_7$ and auxiliary current source transistor $Q_8$, so the write connection transistor $Q_9$ is not turned on.

In a write operation of the PDIC, a strong optical signal is inputted to the photoelectric conversion device 41, thereby causing strong current to be generated therein. The write switching transistor $Q_2$ is turned on in response to the voltage signal at the switching terminal SW of the switching block 45. As a result, current flows through the current source transistors $Q_7$ and $Q_8$, and the write connection transistor $Q_9$ is turned on by means of the write current mirrors 44-1 and 44-2 to transfer the current generated in the photoelectric conversion device 41 to the input terminal of the amplifier 46 through the current source current mirror 42.

In the write mode, if 5V is inputted to the switching terminal SW, the transistor $Q_1$ is turned off and the transistors $Q_4$ and $Q_6$ are in turn turned off. Also, the base voltage of the transistor $Q_2$ becomes $V_X = V_{CC}/2 = 2.5V$, thereby causing the transistor $Q_2$ to be turned on.

In the write mode, the write current mirror 44-1 composed of the write connection transistor $Q_9$ and the write current mirror 44-2 composed of the write current source transistor $Q_7$ and auxiliary write current source transistor $Q_8$ receive current from the write switching transistor $Q_2$ and supply bias current to the input terminal of the amplifier 46 at the same time as turning on the write connection transistor $Q_9$.

Since the transistor $Q_2$ is on and the transistor $Q_1$ is off, current flows through the write current source transistor $Q_7$ and auxiliary write current source transistor $Q_8$ so as to turn on the write connection transistor $Q_9$. As a result, the PDIC is operated in the write mode. Because the transistor $Q_1$ remains off, no current flows through the transistors $Q_4$ and $Q_6$, so the read connection transistor $Q_5$ does not conduct.

Figure 5:
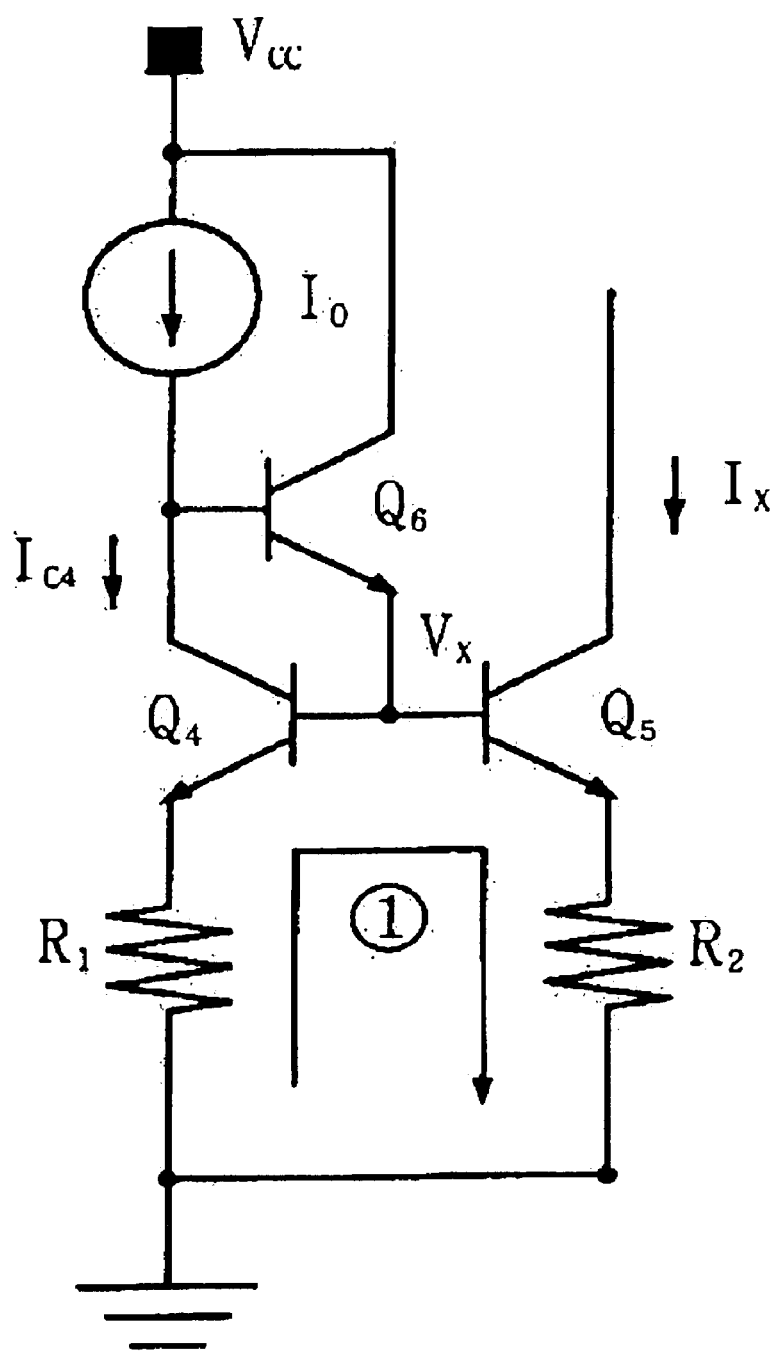
FIG. 5 is a circuit diagram showing a connection between a switching block and a read connection transistor in a read mode according to the embodiment of the present invention.
Figure 6:
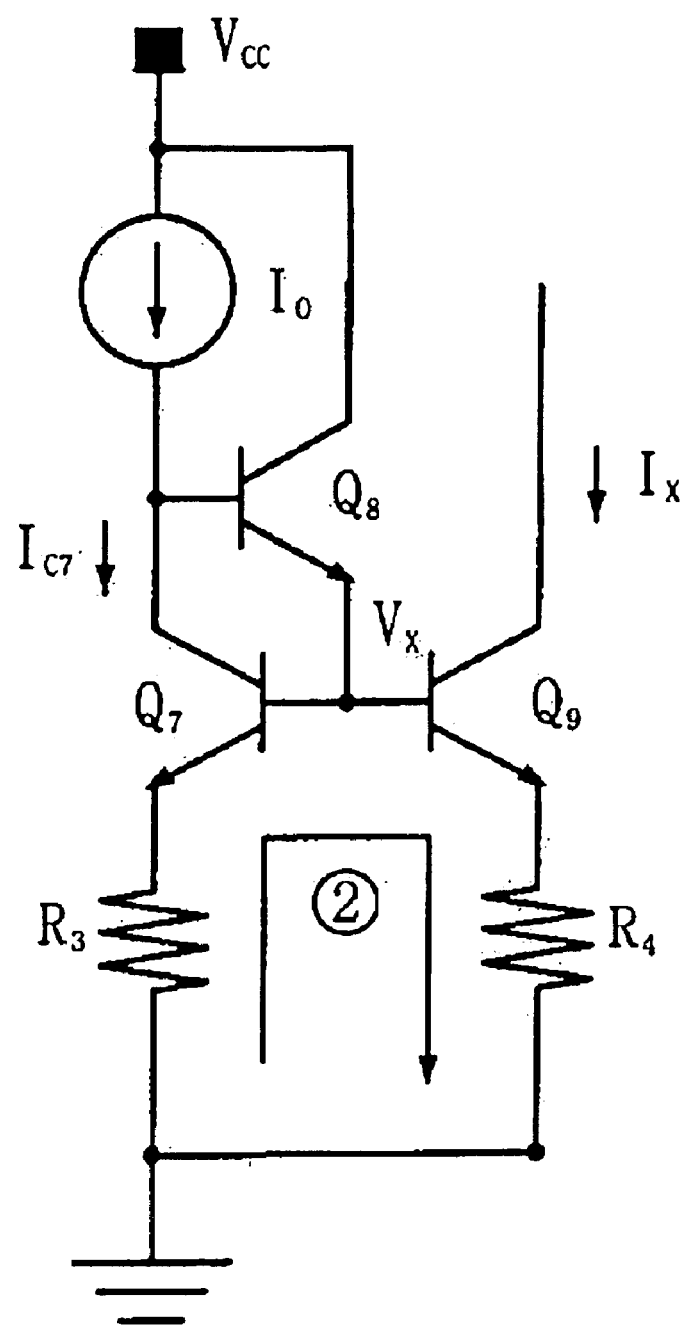
FIG. 6 is a circuit diagram showing a connection between the switching block and a write connection transistor in a write mode according to the embodiment of the present invention.

FIGS. 5 and 6 are circuit diagrams illustrating the operations of the read current mirrors 43-1 and 43-2 and write current mirrors 44-1 and 44-2 in the current to voltage conversion circuit according to the first embodiment of the present invention, respectively.

FIG. 5 illustrates the connections and operations of the read current mirrors ($Q_4$, $Q_6$ and $Q_5$) activated in the read mode, namely, in the state where 0V is inputted to the switching terminal SW of FIG. 4, so the read switching transistor $Q_1$ is turned on and the write switching transistor $Q_2$ is turned off.

With reference to FIG. 5, $I_O$ is bias current provided by the constant current source 47 of FIG. 4.

Applying Kirchhoff's voltage law to a loop ① and assuming that $I_{B4}$ and $I_{B5} = 0$, the result is:

$$I_{C4} \cdot R_1 + V_{BE4} = I_x \cdot R_2 + V_{BE5} \quad \text{(Eq. 5-1)}$$

$$V_{BE5} - V_{BE4} = I_{C4} \cdot R_1 - I_x \cdot R_2 \quad \text{(Eq. 5-2)}$$

Rewriting this equation, the result is:

$$V_T \cdot \ln\left(\frac{I_{c5}}{I_{s5}}\right) - V_T \cdot \ln\left(\frac{I_{c4}}{I_{s4}}\right) = I_{c4} \cdot R_1 - I_x \cdot R_2 \quad \text{(Eq. 5-3)}$$

Here, $V_T$ is a thermal voltage, which has a value of about 25.2 mV at normal temperature. $I_{S4}$ and $I_{S5}$ are saturation currents of the transistors $Q_4$ and $Q_5$, respectively.

Rearranging the above equation 5-3, the result is:

$$V_T \cdot \ln\left(\frac{I_{c5}}{I_{c4}}\right) = I_{c4} \cdot R_1 \left(1 - \frac{I_x \cdot R_2}{I_{c4} \cdot R_1}\right) \quad \text{(Eq. 5-4)}$$

Assuming that $I_{C4} \approx I_O$, $I_{C5} \approx I_x$, the result is:

$$\frac{I_x}{I_{c4}} = \frac{R_1}{R_2} \cdot \left(1 - \frac{V_T \cdot \ln\left(\frac{I_x}{I_{c4}}\right)}{I_O \cdot R_1}\right) \quad \text{(Eq. 5-5)}$$

Assuming that $$V_T \cdot \ln\left(\frac{I_x}{I_{c4}}\right) \ll I_{c4} \cdot R_1,$$

the above equation 5-5 can be expressed as follows:

$$\frac{I_x}{I_{c4}} \approx \frac{R_1}{R_2} \quad \text{(Eq. 5-6)}$$

$$I_o = I_{B6} + I_{c4} = \frac{I_{c4} + I_x}{\beta(1+\beta)} + I_{c4} \quad \text{(Eq. 5-7)}$$

From the above equations 5-6 and 5-7, the below equation can be obtained:

$$I_x = \frac{\beta(1+\beta)}{\frac{R_2}{R_1}(\beta^2 + \beta + 1) + 1} I_o \quad \text{(Eq. 5-8)}$$

The final output voltage $V_{out}$ in consideration of the gain of the amplifier 46 can be expressed as in the below equation:

$$V_{OUT} = P_{op} \cdot R \cdot \frac{\beta^2 + \beta}{\frac{R_2}{R_1}(\beta^2 + \beta + 1) + 1} \cdot R_F \quad \text{(Eq. 5-9)}$$

Here, $P_{OP}$ is power (W) of an input optical signal, R is a resistance (Ω) of the photodiode and $R_F$ is a feedback resistance (Ω).

As can be seen from the above equation 5-9, without varying the feedback resistance $R_F$ of the amplifier 46, the output voltage $V_{out}$ can be regulated appropriately to the read mode by adjusting the ratio of $R_2/R_2$.

In another embodiment of the present invention, the second resistor $R_2$ may not be used.

FIG. 6 illustrates the connections and operations of the write current mirrors 44-1 and 44-2 activated in the write mode, namely, in the state where 5V is inputted to the switching terminal SW of FIG. 4, so the write switching transistor $Q_2$ of FIG. 4 is turned on and the read switching transistor $Q_1$ of FIG. 4 is turned off.

With reference to FIG. 6, $I_O$ is bias current provided by the constant current source 47 of FIG. 4.

Applying Kirchhoff's voltage law to a loop ② and assuming that $I_{B7}$ and $I_{B9} \approx 0$, the result is:

$$I_o \cdot R_3 + V_{BE7} = I_y \cdot R_4 + V_{BE9} \quad \text{(Eq. 6-1)}$$

$$V_{BE9} - V_{BE7} = I_{C7} \cdot R_3 - I_y \cdot R_4 \quad \text{(Eq. 6-2)}$$

Rewriting this equation 6-2, the result is:

$$V_T \cdot \ln\left(\frac{I_{c9}}{I_{s9}}\right) - V_T \cdot \ln\left(\frac{I_{c7}}{I_{s7}}\right) = I_{c7} \cdot R_3 - I_y \cdot R_4 \quad \text{(Eq. 6-3)}$$

Here, $V_T$ is a thermal voltage, which has a value of about 25.2 mV at normal temperature. $I_{S7}$ and $I_{S9}$ are saturation currents of the transistors $Q_7$ and $Q_9$, respectively.

Rearranging the above equation 6-3, the result is:

$$V_T \cdot \ln\left(\frac{I_{c9}}{I_{c7}}\right) = I_{c7} \cdot R_1 \left(1 - \frac{I_y \cdot R_4}{I_{c7} \cdot R_3}\right) \quad \text{(Eq. 6-4)}$$

Assuming that $|_{C7} \approx |_O$, $|_{C9} \approx |_x$, the result is:

$$\frac{I_y}{I_{c7}} = \frac{R_3}{R_4} \cdot \left(1 - \frac{V_T \cdot \ln\left(\frac{I_y}{I_{c7}}\right)}{I_{c7} \cdot R_1}\right) \quad \text{(Eq. 6-5)}$$

Assuming that $$V_T \cdot \ln\left(\frac{I_y}{I_{c7}}\right) \ll I_{c7} \cdot R_3,$$

the above equation 6-5 can be expressed as follows:

$$\frac{I_y}{I_{c7}} \approx \frac{R_3}{R_4} \quad \text{(Eq. 6-6)}$$

$$I_o = I_{B8} + I_{c7} = \frac{I_{c7} + I_y}{\beta(1+\beta)} + I_{c7} \quad \text{(Eq. 6-7)}$$

From the above equations 6-6 and 6-7, the following equation can be obtained:

$$I_y = \frac{\beta(1+\beta)}{\frac{R_4}{R_3}(\beta^2 + \beta + 1) + 1} I_o \quad \text{(Eq. 6-8)}$$

The final output voltage $V_{out}$ in consideration of the gain of the amplifier 46 can be expressed as in the following equation:

$$V_{OUT} = P_{op} \cdot R \cdot \frac{\beta(1+\beta)}{\frac{R_4}{R_3}(\beta^2 + \beta + 1) + 1} \cdot R_F \quad \text{(Eq. 6-9)}$$

Here, $P_{OP}$ is power (W) of an input optical signal, R is a resistance (Ω) of the photodiode and $R_F$ is a feedback resistance (Ω).

As can be seen from the above equation 6-9, without varying the feedback resistance $R_F$ of the amplifier 46, the output voltage $V_{out}$ can be regulated appropriately to the write mode by adjusting the ratio of $R_4/R_3$.

In another embodiment of the present invention, the fourth resistor $R_4$ may not be used.

In another embodiment of the present invention, each of the read current source transistor $Q_4$ and write current source transistor $Q_7$ may be operated as one constant current source for performing the same function without using the auxiliary current source transistor $Q_6$ or $Q_8$. That is, the read current mirror. 43-2 may be configured by merely connecting the collector terminal and base terminal of the read current source transistor $Q_4$ with each other, and the write current mirror 44-2 may be configured by merely connecting the collector terminal and base terminal of the write current source transistor $Q_7$ with each other.

As can be seen from the above equations 5-9 and 6-9, in the current to voltage conversion circuit according to the first embodiment of the present invention, the output voltage $V_{out}$ of the amplifier 46 can be regulated by adjusting the ratio of $R_2/R_1$ or $R_4/R_3$ without varying the feedback resistance $R_F$ of the amplifier 46. Therefore, the output voltage $V_{out}$ can be maintained constant irrespective of the amount of current generated in the photoelectric conversion device. This gain switching can prevent the amplifier 46 from being saturated.

In the read mode, the ratio of $R_2/R_1$ in the equation 5-9 is adjusted to a higher value since the current $I_O$ generated in the photoelectric conversion device is smaller. In the write mode, the ratio of $R_4/R_3$ in the equation 6-9 is adjusted to a lower value since the current $I_O$ generated in the photoelectric conversion device is larger. In this manner, the gain switching can be performed according to the modes without varying the feedback resistance $R_F$.

The amplifier 46 ideally has an infinite gain and constant DC input voltage, but practically a limited gain and variable DC input voltage, resulting in an offset voltage being generated therein. For this reason, a resistor $R_c$ is connected to another input terminal of the amplifier 46 to set the offset voltage of the amplifier 46 to 0.

As described above, since the output voltage $V_{out}$ is maintained constant at about 200 mV in the read mode and at about 100 mV in the write mode, the amplifier 46 remains active by means of the gain switching, not saturated. In a different manner from the conventional current to voltage conversion circuit wherein different feedback resistances, $R_F$ are used according to the read mode and write mode and, in particular, a relatively low-resistance feedback resistor is used in the write mode to limit the output voltage, the current to voltage conversion circuit for the PDIC employing the gain switching circuit according to the embodiment of the present invention performs the current to voltage conversion through the single feedback resistance $R_F$ irrespective of the modes, thereby making it possible to avoid problems issued when the different feedback resistances are used according to the modes.

Figure 7:
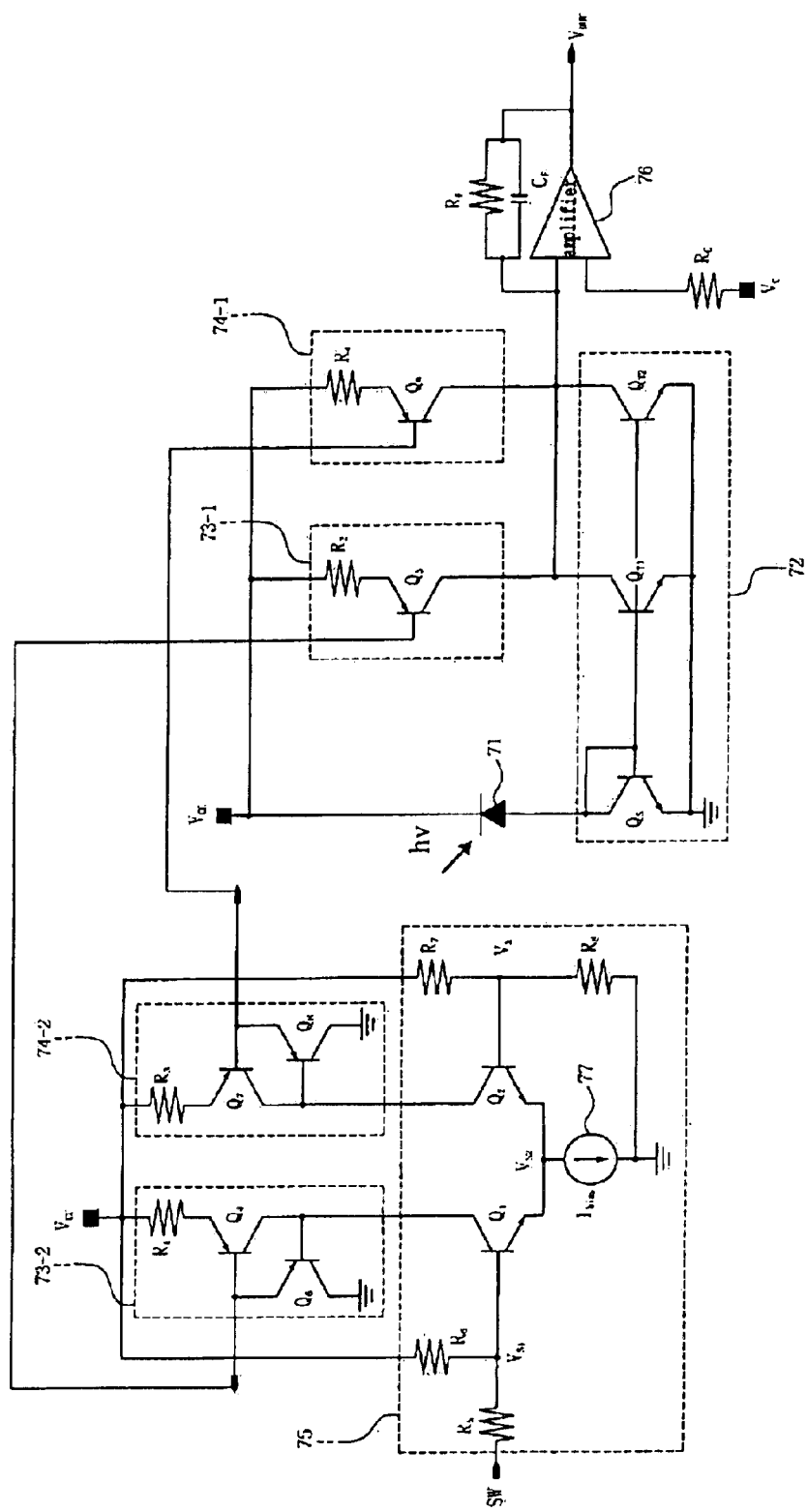
FIG. 7 is a circuit diagram showing the configuration of a current to voltage conversion circuit employing a gain switching circuit according to an alternative embodiment of the present invention.

FIG. 7 is a circuit diagram showing the configuration of a current to voltage conversion circuit employing a gain switching circuit according to an alternative embodiment of the present invention.

In FIG. 7, a current mirror 72 is provided with transistors $Q_s$, $Q_{T1}$ and $Q_{T2}$ and adapted to allow current generated in a photoelectric conversion device 71 to flow to a read connection transistor $Q_5$ and write connection transistor $Q_9$ by means of mirroring.

If an optical signal is inputted to the photoelectric conversion device 71, such as a photodiode, current $I_{PH}$ is generated in the device 71 in proportion to the intensity of the inputted light. The generated current $I_{PH}$ flows from an emitter of the transistor $Q_s$ to a collector thereof, and almost the same amount of current as that of the current flowing through the transistor $Q_s$ flows through each of the transistors $Q_{T1}$ and $Q_{T2}$. In a read mode, current flows to the read connection transistor $Q_5$ through a current mirror consisting of the transistors $Q_s$ and $Q_{T1}$. In a write mode, current flows to the write connection transistor $Q_9$ through a current mirror consisting of the transistors $Q_s$ and $Q_{T2}$.

In FIG. 7, a current source 77 is a constant bias current source for applying bias current.

It is here assumed that a drive voltage $V_{CC}$ is 5V and a voltage-dividing resistor $R_7$ and a voltage-dividing resistor $R_8$ have the same resistances, namely, $R_7 = R_8$. It will be understood that these assumptions may be modified according to different embodiments of the present invention.

In the read mode, if 0V is inputted to a switching terminal SW, then $V_X = V_{CC}/2 = 2.5V$ according to the voltage divider rule since $R_7 = R_8$. When 0V is inputted to the switching terminal SW, a base voltage of a read switching transistor $Q_1$ becomes $$\frac{R_5}{R_5+R_6}\cdot V_{cc}$$

according to the voltage divider rule and an emitter voltage thereof becomes $V_x$–0.7V. The read switching transistor $Q_1$ is turned on under the condition that an emitter-base voltage $V_{BEQ1}$ thereof exceeds 0.7V, namely, $$\frac{R_5}{R_5+R_6}\cdot V_{cc} - (V_x - 0.7) > 0.7 \text{ V}.$$

Here, because $V_x=V_{CC}/2$, the transistor $Q_1$ is turned on when $R_5>R_6$.

Preferably, $R_5$ is set to four times $R_6$, namely, $R_5=4R_6$, to guarantee a stable circuit operation.

Assuming that $R_5=4R_6$, a switching block 75 of FIG. 7 is operated in the following manner. Because the base voltage $V_{S1}$ of the transistor $Q_1$ is 4V according to the voltage divider rule, the transistor $Q_1$ is turned on, so the emitter voltage $V_{S2}$ thereof becomes $V_{S1}$–0.7=3.3V. At this time, since the base voltage $V_X$ of a write switching transistor $Q_2$ is 2.5V and the emitter voltage $V_{S2}$ thereof is. 3.3V, the transistor $Q_2$ remains off.

Since the transistor $Q_1$ is on and the transistor $Q_2$ is off, current flows through a read current source transistor $Q_4$ and auxiliary read current source transistor $Q_6$ so as to activate read current mirrors 73-1 and 73-2. As a result, the read connection transistor $Q_5$ is turned on to supply bias current to an input terminal of an amplifier 76. Because the transistor $Q_2$ remains off, write current mirrors 74-1 and 74-2 are kept inactive, so the write connection transistor $Q_9$ remains off.

In the write mode, if 5V is inputted to the switching terminal SW, the transistor $Q_1$ is turned off and the transistors $Q_4$ and $Q_6$ are in turn turned off. Also, the base voltage of the transistor $Q_2$ becomes $V_{CC}/2=2.5V$, thereby causing the transistor $Q_2$ to be turned on.

Since the transistor $Q_2$ is on and the transistor $Q_1$ is off, a write current source transistor $Q_7$ and auxiliary write current source transistor $Q_8$ are turned on, so as to turn on the write connection transistor $Q_9$. As a result, the PDIC is operated in the write mode. Because the transistor $Q_1$ remains off, the transistors $Q_4$ and $Q_6$ are not turned on, so the read connection transistor $Q_5$ does not conduct.

In the read mode, the read current mirror 73-1 composed of the read connection transistor $Q_5$ and the read current mirror 73-2 composed of the read current source transistor $Q_4$ and auxiliary read current source transistor $Q_6$ receive current from the read switching transistor $Q_1$ and supply bias current to the input terminal of the amplifier 76 at the same time as turning on the read connection transistor $Q_5$.

Because the transistor $Q_1$ is on and the transistor $Q_2$ is off, current flows through the read current source transistor $Q_4$ and auxiliary read current source transistor $Q_6$ so as to activate the read current mirrors 73-1 and 73-2. As a result, the read connection transistor $Q_5$ is turned on to supply current to the PDIC, thereby allowing the PDIC to be operated in the read mode. Because the transistor $Q_2$ remains off, the write current mirrors 74-1 and 74-2 are kept inactive and no current flows through the current source transistor $Q_7$ and auxiliary current source transistor $Q_8$, so the write connection transistor $Q_9$ is not turned on.

In a write operation of the PDIC, a strong optical signal is inputted to the photoelectric conversion device 71, thereby causing strong current to be generated therein. The write switching transistor $Q_2$ is turned on in response to the voltage signal at the switching terminal SW of the switching block 75. As a result, current flows through the current source transistors $Q_7$ and $Q_8$, and the write connection transistor $Q_9$ is turned on by means of the write current mirrors 74-1 and 74-2 to transfer the current generated in the photoelectric conversion device 71 to the input terminal of the amplifier 76 through the current source current mirror 72.

In the write mode, if 5V is inputted to the switching terminal SW, the transistor $Q_1$ is turned off and the transistors $Q_4$ and $Q_6$ are in turn turned off. Also, the base voltage of the transistor $Q_2$ becomes $V_x=V_{CC}/2=2.5V$, thereby causing the transistor $Q_2$ to be turned on.

In the write mode, the write current mirror 74-1 composed of the write connection transistor $Q_9$ and the write current mirror 74-2 composed of the write current source transistor $Q_7$ and auxiliary write current source transistor $Q_8$ receive current from the write switching transistor $Q_2$ and supply bias current to the input terminal of the amplifier 76 at the same time as turning on the write connection transistor $Q_9$.

Because the transistor $Q_2$ is on and the transistor $Q_1$ is off, current flows through the write current source transistor $Q_7$ and auxiliary write current source transistor $Q_8$ so as to turn on the write connection transistor $Q_9$ of FIG. 7. As a result, the PDIC is operated in the write mode. Since the transistor $Q_1$ remains off, no current flows through the transistors $Q_4$ and $Q_6$, so the read connection transistor $Q_5$ does not conduct.

In the second embodiment of FIG. 7, in a similar manner to the first embodiment of FIG. 4, the output voltage $V_{out}$ of the amplifier 76 can be regulated according to the read mode or write mode by adjusting the ratio of $R_2/R_1$ or $R_4/R_3$ without varying the feedback resistance $R_F$ of the amplifier 76. Therefore, the output voltage $V_{out}$ can be maintained constant irrespective of the amount of current generated in the photoelectric conversion device. This gain switching can prevent the amplifier 76 from being saturated.

As apparent from the above description, the present invention provides a current to voltage conversion circuit employing a gain switching circuit, which is capable of transferring photocurrent generated in a photoelectric conversion device such as a photodiode to an amplifier by means of mirroring, thereby raising a bias voltage to the photoelectric conversion device and enhancing a response speed thereof.

Further, according to the present invention, the amount of current generated in the photoelectric conversion device can be increased or reduced through control of a resistance ratio of a current mirror circuit so that a low feedback resistance can be used for the amplifier, so as to enhance frequency characteristics of the amplifier.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A current to voltage conversion circuit employing a gain switching circuit, comprising:

a photoelectric conversion device for receiving an optical signal and generating current corresponding thereto;

current source current mirror means connected between a drive voltage and said photoelectric conversion device for supplying the same amount of current as that of the current generated by said photoelectric conversion device;

an amplifier for receiving a current signal and outputting a voltage signal corresponding thereto;

read current mirror means for transferring the current from said current source current mirror means to an input terminal of said amplifier in response to a switching control signal;

write current mirror means for transferring said current from said current source current mirror means to said input terminal of said amplifier in response to said switching control signal;

switching means for selectively turning on said read current mirror means and said write current mirror means in response to said switching control signal; and a feedback resistor connected between said input terminal of said amplifier and an output terminal of said amplifier.

2. The current to voltage conversion circuit as set forth in claim 1, wherein said current source current mirror means includes:

a source transistor connected to said drive voltage; and first and second target transistors, each of said target transistors allowing the same amount of current as that of current flowing through said source transistor to flow therethrough.

3. The current to voltage conversion circuit as set forth in claim 1, wherein said read current mirror means includes:

a read connection transistor for transferring said current from said current source current mirror means to said amplifier;

a read current source transistor for receiving current from said switching means to turn on said read connection transistor;

a first read emitter resistor connected to an emitter of said read current source transistor; and a second read emitter resistor connected to an emitter of said read connection transistor.

4. The current to voltage conversion circuit as set forth in claim 3, wherein said read current mirror means further includes an auxiliary read current source transistor connected between a base of said read current source transistor and a collector thereof.

5. The current to voltage conversion circuit as set forth in claim 1, wherein said read current mirror means includes:

a read connection transistor for transferring said current from said current source current mirror means to said amplifier;

a read current source transistor for receiving current from said switching means to turn on said read connection transistor; and a read emitter resistor connected to an emitter of said read current source transistor.

6. The current to voltage conversion circuit as set forth in claim 1, wherein said read current mirror means includes:

a read connection transistor for transferring said current from said current source current mirror means to said amplifier;

a read current source transistor for receiving current from said switching means to turn on said read connection transistor; and a read emitter resistor connected to an emitter of said read connection transistor.

7. The current to voltage conversion circuit as set forth in claim 1, wherein said write current mirror means includes:

a write connection transistor for transferring said current from said current source current mirror means to said amplifier;

a write current source transistor connected to said write connection transistor for receiving current from said switching means to allow current to flow to said write connection transistor by virtue of mirroring;

a first write emitter resistor connected to an emitter of said write current source transistor; and a second write emitter resistor connected to an emitter of said write connection transistor.

8. The current to voltage conversion circuit as set forth in claim 7, wherein said write current mirror means further includes an auxiliary write current source transistor connected between a base of said write current source transistor and a collector thereof.

9. The current to voltage conversion circuit as set forth in claim 1, wherein said write current mirror means includes:

a write connection transistor for transferring said current from said current source current mirror means to said amplifier;

a write current source transistor connected to said write connection transistor for receiving current from said switching means to allow current to flow to said write connection transistor by virtue of mirroring; and a write emitter resistor connected to an emitter of said write current source transistor.

10. The current to voltage conversion circuit as set forth in claim 1, wherein said write current mirror means includes:

a write connection transistor for transferring said current from said current source current mirror means to said amplifier;

a write current source transistor connected to said write connection transistor for receiving current from said switching means to allow current to flow to said write connection transistor by virtue of mirroring; and a write emitter resistor connected to an emitter of said write connection transistor.

11. The current to voltage conversion circuit as set forth in claim 1, wherein said switching means includes:

a read switching transistor turned on in response to said switching control signal in a read mode;

a write switching transistor turned on in response to said switching control signal in a write mode;

a first switching resistor connected between a switching control signal input terminal and a base of said read switching transistor;

a second switching resistor connected between said drive voltage and said base of said read switching transistor;

a first voltage-dividing resistor connected between said drive voltage and a base of said write switching transistor; and a second voltage-dividing resistor connected between said first voltage-dividing resistor and a ground terminal.

12. The current to voltage conversion circuit as set forth in claim 11, wherein said first switching resistor, second switching resistor, first voltage-dividing resistor and second voltage-dividing resistor have resistances set to turn on said read switching transistor and turn off said write switching transistor, when said switching control signal is 0V.

13. The current to voltage conversion circuit as set forth in claim 11, wherein said second switching resistor has a resistance which is four times that of said first switching resistor.

14. The current to voltage conversion circuit as set forth in claim 11, wherein said first voltage-dividing resistor and said second voltage-dividing resistor have the same resistances.

* * * * *